(12) United States Patent
Haratipour et al.

(10) Patent No.: US 11,901,400 B2
(45) Date of Patent: Feb. 13, 2024

(54) MFM CAPACITOR AND PROCESS FOR FORMING SUCH

(71) Applicant: Intel Corporation, Santa Clara, CA (US)

(72) Inventors: Nazila Haratipour, Hillsboro, OR (US); Chia-Ching Lin, Portland, OR (US); Sou-Chi Chang, Portland, OR (US); Ashish Verma Penumatcha, Hillsboro, OR (US); Owen Loh, Portland, OR (US); Mengcheng Lu, Portland, OR (US); Seung Hoon Sung, Portland, OR (US); Ian A. Young, Portland, OR (US); Uygar Avci, Portland, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 911 days.

(21) Appl. No.: 16/369,737

(22) Filed: Mar. 29, 2019

(65) Prior Publication Data
US 2020/0312950 A1    Oct. 1, 2020

(51) Int. Cl.
| | |
|---|---|
| *H01L 49/02* | (2006.01) |
| *H01G 4/012* | (2006.01) |
| *H01G 4/30* | (2006.01) |
| *H01L 23/522* | (2006.01) |
| *H10B 51/00* | (2023.01) |

(52) U.S. Cl.
CPC ............. *H01L 28/56* (2013.01); *H01G 4/012* (2013.01); *H01G 4/30* (2013.01); *H01L 23/5226* (2013.01); *H10B 51/00* (2023.02)

(58) Field of Classification Search
CPC ................. H01L 28/56; H01L 23/5226; H01L 27/11585; H01L 27/1159; H01L 28/90; H01L 28/55–57; H01G 4/012; H01G 4/30; H01G 4/1227; H01G 4/33
See application file for complete search history.

(56) References Cited

U.S. PATENT DOCUMENTS

| | | | | |
|---|---|---|---|---|
| 5,384,729 | A * | 1/1995 | Sameshima | H01L 27/11585 257/295 |
| 5,907,762 | A * | 5/1999 | Evans | H01L 29/78391 257/E21.409 |
| 6,537,830 | B1 * | 3/2003 | Arita | C23C 18/1283 257/411 |
| 10,276,697 | B1 * | 4/2019 | Lu | H01L 29/66545 |
| 10,403,631 | B1 * | 9/2019 | Lu | H01L 27/11514 |
| 10,600,808 | B2 * | 3/2020 | Schröder | H01L 27/1159 |
| 10,916,654 | B2 * | 2/2021 | Fujii | H01L 27/11597 |
| 11,362,172 | B2 * | 6/2022 | Radosavljevic | H01L 28/56 |

(Continued)

OTHER PUBLICATIONS

Applied Physics Express 10, 081501 (2017) (Year: 2017).*
IEEE Electron Device Letters, vol. 40, No. 5, May 2019 (Year: 2019).*

*Primary Examiner* — Jarrett J Stark
(74) *Attorney, Agent, or Firm* — Schwabe, Williamson & Wyatt, P.C.

(57) ABSTRACT

A capacitor is disclosed that includes a first metal layer and a seed layer on the first metal layer. The seed layer includes a polar phase crystalline structure. The capacitor also includes a ferroelectric layer on the seed layer and a second metal layer on the ferroelectric layer.

19 Claims, 11 Drawing Sheets

(56) References Cited

U.S. PATENT DOCUMENTS

| | | | |
|---|---|---|---|
| 11,373,727 B1* | 6/2022 | Wilkerson | G11C 29/18 |
| 2002/0149042 A1* | 10/2002 | Tarui | H01L 29/40111 |
| | | | 257/295 |
| 2004/0129961 A1* | 7/2004 | Paz de Araujo | H01L 23/642 |
| | | | 257/295 |
| 2010/0072527 A1* | 3/2010 | Ozaki | H01L 27/11507 |
| | | | 257/295 |
| 2012/0261773 A1* | 10/2012 | Ogawa | H01L 21/02164 |
| | | | 257/E21.409 |
| 2020/0051607 A1* | 2/2020 | Pan | H01L 27/11509 |
| 2020/0312949 A1* | 10/2020 | Haratipour | H01G 4/33 |
| 2020/0312950 A1* | 10/2020 | Haratipour | H01L 27/11585 |
| 2020/0365682 A1* | 11/2020 | Lu | H01L 28/40 |
| 2021/0202507 A1* | 7/2021 | Thareja | G11C 11/221 |
| 2021/0408223 A1* | 12/2021 | Chia | H01L 28/56 |

\* cited by examiner

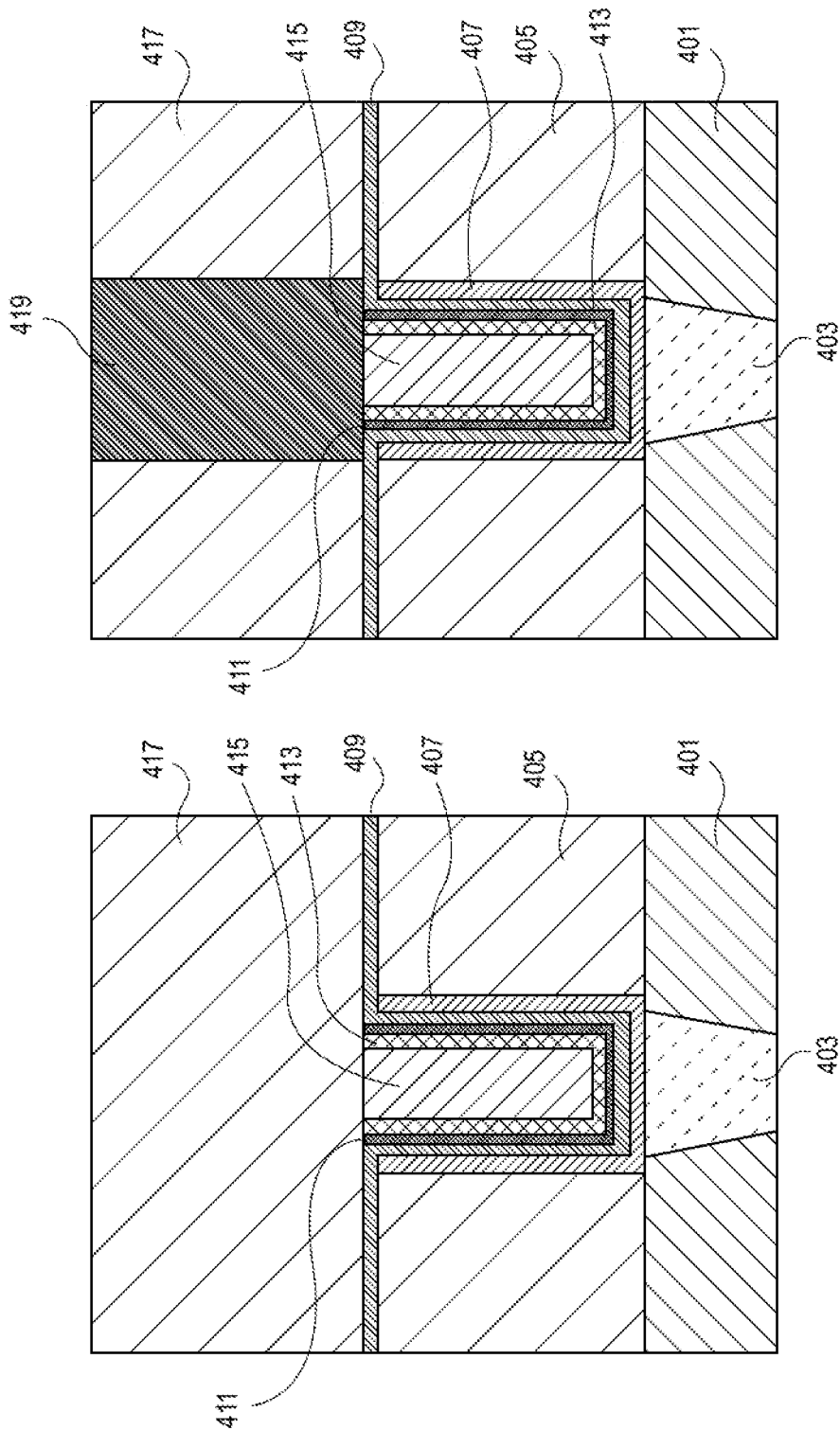

MFM CAPACITOR AND PROCESS FOR FORMING SUCH

TECHNICAL FIELD

Embodiments of the disclosure pertain to metal-ferroelectric-metal (MFM) capacitors and, in particular, to MFM capacitors and processes for forming such.

BACKGROUND

Stabilization of orthorhombic polar phase in certain doped-oxides can induce ferroelectricity. As a part of the stabilization of orthorhombic polar phase, approaches to reducing undesirable phase transitions have proven unsatisfactory.

BRIEF DESCRIPTION OF THE DRAWINGS

FIGS. 4A-4D illustrate cross-sections of an MFM capacitor during a process of fabricating the MFM capacitor according to an embodiment.

DESCRIPTION OF THE EMBODIMENTS

Figure 1:
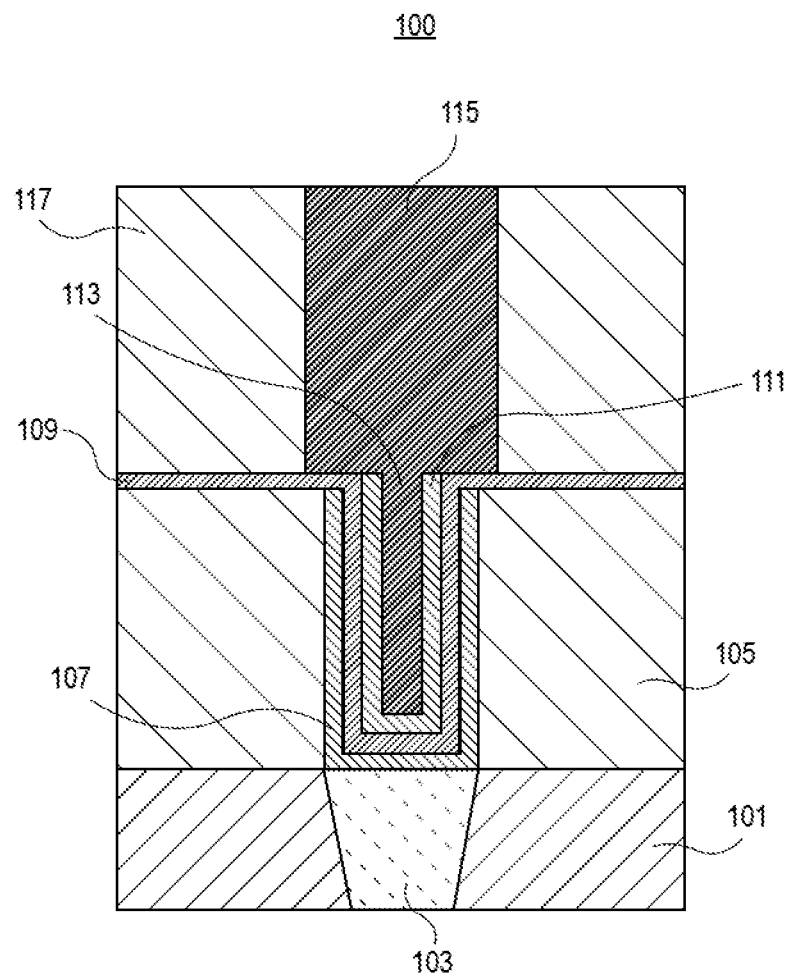
FIG. 1 illustrates a metal-ferroelectric-metal (MFM) capacitor of a previous approach.

Metal-ferroelectric-metal (MFM) capacitors with multilayer oxides and metals are described. It should be appreciated that although embodiments are described herein with reference to example MFM capacitors with multilayer oxides and metals implementations, the disclosure is more generally applicable to MFM capacitors with multilayer oxides and metals implementations as well as other type MFM capacitors with multilayer oxides and metals implementations. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

(Anti-)Ferroelectricity in metal-ferroelectric-metal (MFM) capacitors is due to the tetragonal and/or polar orthorhombic-phase crystalline structure of oxide dielectrics. Fabricating MFM capacitors includes post oxide deposition anneal operations. In practical applications, the deposition is usually performed at high temperatures. During the post oxide deposition anneal operations a phase transition can occur. Particularly, during the post oxide deposition anneal operations there can be a mixture of orthorhombic, tetragonal and monoclinic phases. However, the undesirable monoclinic phase transitions that occur during post oxide deposition anneal operations can negatively impact performance.

An approach that addresses the shortcomings of previous approaches is disclosed and described herein. For example, as part of a disclosed process, a seed layer with preferred lattice constant (that is close to polar/non-centrosymmetric crystalline phase) can be used as a templating layer that causes polar phase growth so that the oxide phase can be locked/stabilized during oxide deposition. Additionally, the oxide layer can be capped after deposition with a thin low temperature metal and a post-deposition anneal performed to apply a mechanical constraint on the oxide that prevents a transition of the oxide to non-polar phase.

FIG. 1 illustrates an MFM capacitor 100 with multilayer oxides and metals of a previous approach. In FIG. 1, the MFM capacitor includes dielectric layer 101, metal via 103, dielectric layer 105, metal 107, ferroelectric layer 109, metal 111, metal fill 113, connector metal 115, and dielectric layer 117.

Referring to FIG. 1, dielectric layer 101 includes a via that is filled to form metal via 103. Dielectric layer 105 includes a trench that is lined with bottom electrode metal 107. For example, the bottom electrode metal 107 covers the bottom and sidewalls of the trench. The ferroelectric layer 109 covers the portions of the bottom electrode metal 107 that cover the bottom and sidewalls of the trench. The bottom electrode metal 107 can influence the phase transitions of the ferroelectric layer 109. The ferroelectric layer 109 extends outside the trench and covers the top surface of the dielectric layer 105. The dielectric layer 117 is formed above the portion of the ferroelectric layer 109 that covers the top surface of the dielectric layer 105. The dielectric layer 117 includes a space in which connector metal is formed.

In the FIG. 1 example, it should be appreciated that during the post oxide deposition anneal operations there can be a mixture of orthorhombic, tetragonal and monoclinic phases. However, the undesirable monoclinic phase transitions that occur during post oxide deposition anneal operations can negatively impact performance.

Figure 2:
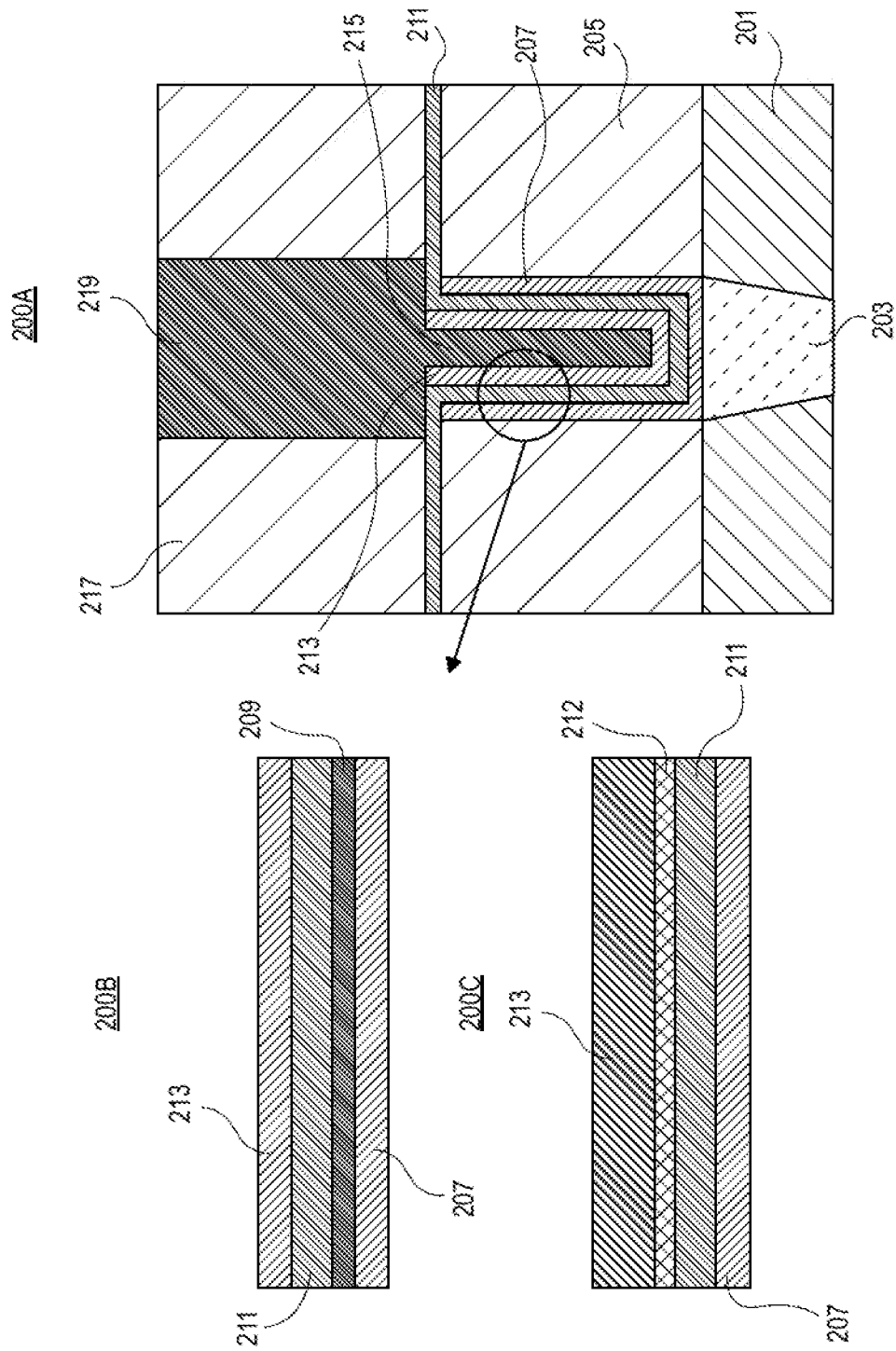
FIG. 2 illustrates an MFM capacitor according to an embodiment.

FIG. 2 illustrates an MFM capacitor 200A with multilayer oxides and metals according to an embodiment. In FIG. 2, the MFM capacitor 200A includes dielectric layer 201, metal via 203, dielectric layer 205, metal 207, ferroelectric layer 211, metal 213, metal fill 215, dielectric layer 217 and connector metal 219. In a first embodiment, the MFM capacitor 200A can include a material stack 200B that includes seed layer 209. In another embodiment, the MFM capacitor 200A can include a material stack 200C that includes low-T metal 212.

Referring to FIG. 2, the dielectric layer 201 includes a via that is filled to form metal via 203. The dielectric layer 205 includes a trench that is lined with metal 207. For example, the ALD metal 207 covers the bottom and sidewalls of the trench. In an embodiment, the trench can be lined with the stack 200B that includes the seed layer 209 or the stack 200C that includes the low-T metal 212. In other embodiments, both a seed layer and a low-T metal cap of the ferroelectric material can be used. The ferroelectric layer 211 is formed above the bottom and sidewall portions of the metal 207. Moreover, the ferroelectric layer 211 extends outside the trench and covers the top surface of the dielectric layer 205. The metal fill 215 is formed in a space defined by the ferroelectric layer 211. The dielectric layer 217 is formed above the portion of the ferroelectric layer 211 that covers the top surface of the dielectric layer 205. The dielectric layer 217 includes a space in which the connector metal 219 is formed.

Referring to FIG. 2, in a first embodiment, where the trench formed in dielectric 205 is lined with the stack 200B that includes metal 207, seed layer 209, ferroelectric layer 211, and metal layer 213, the crystalline phase of the ferroelectric layer 211 is determined by the deposition of the ferroelectric layer 211 onto the seed layer 209. In an embodiment, the material used to form the seed layer 209 is chosen to have a lattice constant that causes the growth of polar crystalline phase oxide layer 211. In an embodiment, the ferroelectric layer 211 is a stronger ferroelectric than is provided in oxide layers (see ferroelectric high-k layer 109 in FIG. 1) utilized in previous approaches due to its controlled polar phase growth during the deposition.

Referring to FIG. 2, in another embodiment, where the trench formed in dielectric 205 is lined with the stack 200C that includes metal 207, ferroelectric layer 211, low-T metal layer 212 and metal layer 213, the phase of the ferroelectric material 211 is determined by the deposition of the low-T metal 212 on the ferroelectric layer 211. In an embodiment, after the ferroelectric layer 211 is capped by the low-T metal 212 (e.g., a thin low temperature conformal metal) a post-deposition anneal is performed to apply a mechanical constraint on the ferroelectric layer 211 in order to avoid a transition of the ferroelectric layer 211 to non-polar phase. In an embodiment, because of the mechanical constraint, the ferroelectric layer 211 is more strongly ferroelectric than the ferroelectric layers that can be provided using previous approaches (see ferroelectric layer 109 in FIG. 1). This is because unlike the ferroelectric layers of previous approaches, the ferroelectric layer 211 is mechanically constrained from transitioning to a non-polar crystalline phase.

In an embodiment, the low-T metal 212 has a higher resistivity than the metal layer 213. In other embodiments, the low-T metal 212 may not have a higher resistivity than the metal layer 213. In an embodiment, the low-T metal 212 has a smaller grain size than the metal layer 213. In other embodiments, the low-T metal 212 may not have a smaller grain size than the metal layer 213.

In an embodiment, the low-T metal 212 is formed at a temperature that is lower than the crystallization temperature of the ferroelectric layer 211. In an embodiment, the low-T metal 212 is annealed to constrain the ferroelectric layer to a polar phase. In an embodiment, the metal layer 213 is formed at a temperature that is higher than the temperature at which the low-T metal 212 is formed. In an embodiment, this technique constrains the ferroelectric layer to a polar phase. In an embodiment, the low-T metal 212 is thinner than the metal layer 213. In other embodiments, the low-T metal 212 may not be thinner than the metal layer 213. In an embodiment, the low-T metal 212 is formed at a temperature that is less than 500 degrees. In other embodiments, the low-T metal 212 can be formed at a temperature that is not less than 500 degrees.

In an embodiment, the dielectric layer 201 can be formed from oxide, nitride, carbon doped oxide or carbon doped nitride. In other embodiments, the dielectric layer 201 can be formed from any other type interlayer dielectric (ILD) material. In an embodiment, the metal via 203 can be formed from tungsten, cobalt, copper, or copper with a TaN liner. In other embodiments, the metal via 203 can be formed from other materials. In an embodiment, the dielectric layer 205 can be formed from oxide. In other embodiments, the dielectric layer 205 can be formed from other types of ILD material. In an embodiment, the metal 207 and the metal layer 213 can be formed from ALD or CVD metals, titanium nitride, tantalum nitride, ruthenium, ruthenium oxide, iridium oxide or titanium silicon oxide. In other embodiments, the metal 207 and the metal layer 213 can be formed from other materials. In an embodiment, the ferroelectric layer 211 can be formed from hafnium zirconium oxide, hafnium oxide, zirconium oxide, aluminum doped hafnium oxide, silicon doped hafnium oxide, yttrium doped hafnium oxide, lanthanum doped zirconium oxide, lanthanum doped hafnium oxide or lead zirconate titanate (PZT). In other embodiments, the ferroelectric layer 211 can be formed from other materials. In an embodiment, the low-T metal 212 can be formed from titanium nitride, tantalum nitride, ruthenium, ruthenium oxide, iridium oxide or titanium silicon oxide. In other embodiments, the low-T metal 212 can be formed from other materials. In an embodiment, the low-T metal 212 is formed in a low temperature process. In an embodiment, the top electrode metal layer 213 can be formed from titanium nitride, tantalum nitride, ruthenium, ruthenium oxide, iridium oxide or titanium silicon oxide. In other embodiments, the top electrode metal layer 213 can be formed from other materials. In an embodiment, the top electrode metal layer 213 is formed in any temperature process other than the process used to form low-T metal 212. In an embodiment, the metal fill 215 can be formed from tungsten, cobalt, copper, or airgap. In an embodiment, the metal fill 215 can be formed from other material. In an embodiment, the dielectric layer 217 can be formed from oxide. In other embodiments, the dielectric layer 217 can be formed from other materials. In an embodiment, the connector metal 219 can be formed from tungsten, cobalt or copper. In other embodiments, the connector metal 219 can be formed from other material.

In operation, the capacitor 200A can be a part of a memory cell and can be charged and discharged as a part of memory operations. The memory window is set by the amount of remnant polarization in the ferroelectric film. This remnant polarization or memory window is maximized by minimizing the undesirable monoclinic or any non-polar phase in the ferroelectric layer.

Figure 3A:
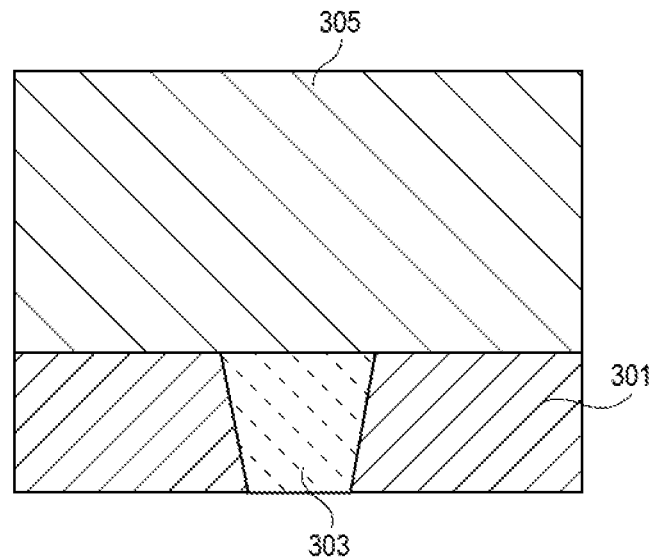
FIGS. 3A-3H illustrate cross-sections of an MFM capacitor during a process of fabricating the MFM capacitor according to an embodiment.

FIGS. 3A-3H shows cross-sections of a MFM capacitor structure that includes multilayer oxides and metals during the fabrication of a MFM capacitor that includes multilayer oxides and metals according to an embodiment. Referring to FIG. 3A, after one or more operations a structure is formed that includes dielectric layer 301, metal via 303 and a dielectric layer 305.

Figure 3B:
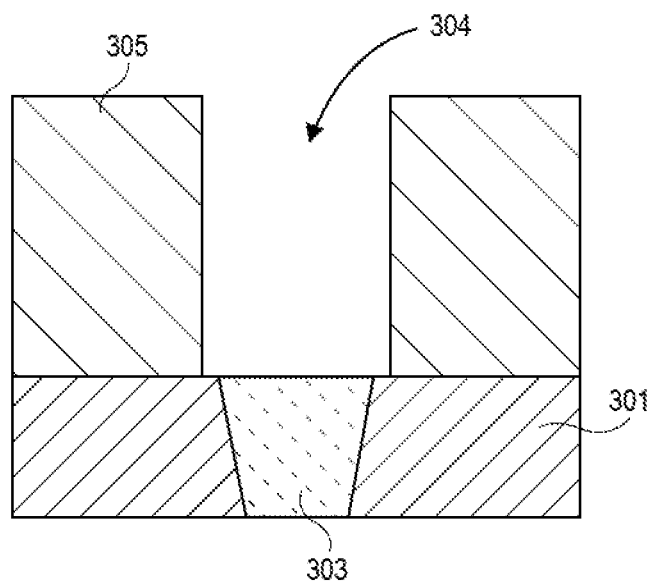

Referring to FIG. 3B, after one or more operations that result in a cross-section of the structure shown in FIG. 3A, a space 304 is formed in the dielectric layer 305. In an embodiment, the space 304 can be formed by removal of ferroelectric material from the dielectric layer 305. In an embodiment, the removal of ferroelectric material can be performed by etching. In an embodiment, the etching can be performed by dry etch or wet etching. In other embodiments, other manners of removing the ferroelectric material can be used.

Figure 3C:
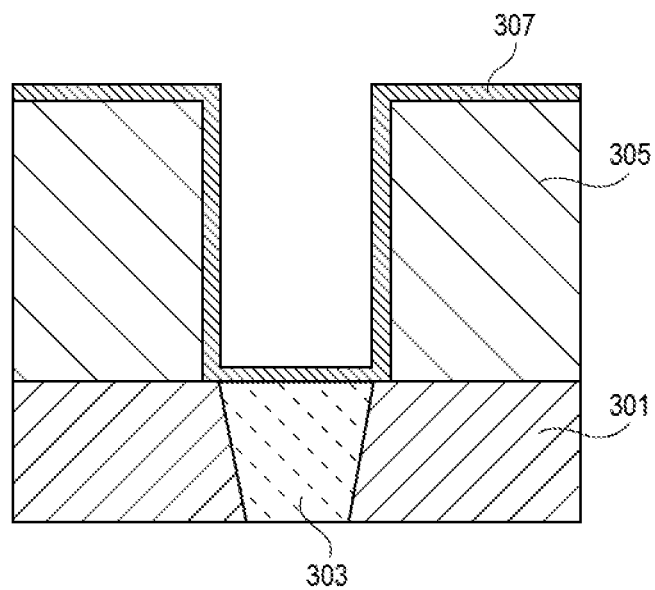

Referring to FIG. 3C, after one or more operations that result in the cross-section shown in FIG. 3B, a metal layer 307 is formed on the trench bottom and sidewalls and above the top surface of dielectric layer 305. In an embodiment, the metal layer 307 is formed by deposition. In an embodiment, the metal layer 307 can be formed by atomic layer deposition (ALD). In other embodiments, the metal layer 307 can be formed in other manners.

Figure 3D:
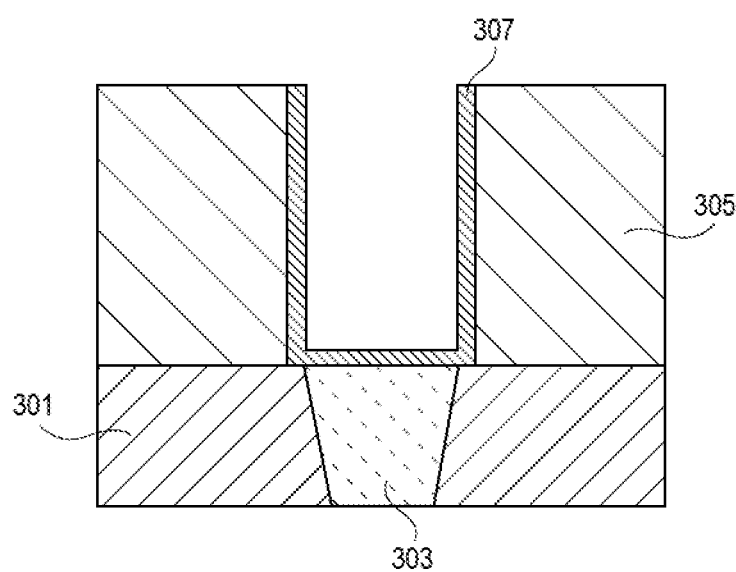

Referring to FIG. 3D, after one or more operations that result in a cross-section shown in FIG. 3C, the portion of the metal layer 307 that is formed on the top surface of the dielectric 305 is removed. In an embodiment, the portion of the metal layer 307 that is formed on the top surface of the dielectric 305 can be removed by etching. In an embodiment, the portion of the metal layer 307 that is formed on the top surface of the dielectric 305 can be removed by wet etching or dry etching. In other embodiments, the portion of the metal layer 307 that is formed on the top surface of the dielectric 305 can be removed in other manners.

Figure 3E:
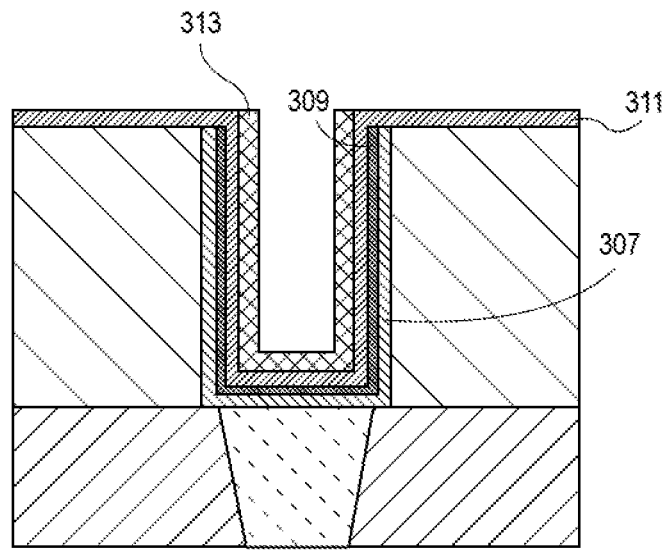

Referring to FIG. 3E, after one or more operations that result in a cross-section shown in FIG. 3D, a seed layer 309, a oxide layer 311 and a second ALD metal layer 313 are formed over the first ALD metal layer 307. In an embodiment, forming the oxide layer 311 on the seed layer 309 and performing a post-deposition anneal causes the oxide layer 311 to be stabilized in ferroelectric phase. In particular, the material that is used to form the seed layer 309 is chosen to have a preferred lattice constant (a lattice constant that is, or is close to, a tetragonal or polar orthorhombic phase). In this manner, the seed layer 309 can be used as a templating layer such that the phase of the oxide layer 311 is caused to be polar orthorhombic during the deposition of the oxide layer 311. In an embodiment, causing the oxide layer 311 to assume a polar orthorhombic phase ensures that the oxide layer 311 is ferroelectric in character.

In an embodiment, the seed layer 309 can be formed from zirconium oxide, hafnium oxide or aluminum oxide. In other embodiments, the seed layer 309 can be formed by other suitable materials. In an embodiment, the seed layer 309 can be formed by atomic layer deposition. In other embodiments, the seed layer 309 can be formed by physical vapor deposition (PVD), chemical vapor deposition (CVD), electrochemical deposition (ECD), or molecular beam epitaxy (MBE). In an embodiment, the oxide layer 311 can be formed by atomic layer deposition. In other embodiments, the oxide layer 311 can be formed by physical vapor deposition (PVD), chemical vapor deposition (CVD), electrochemical deposition (ECD), or molecular beam epitaxy (MBE). It should be appreciated that the seed layer 309 is chosen so as to suppress monoclinic growth in the oxide layer 311. Moreover, in particular, in an embodiment, the seed layer 309 is chosen to promote orthorhombic growth in the oxide layer 311.

Figure 3F:
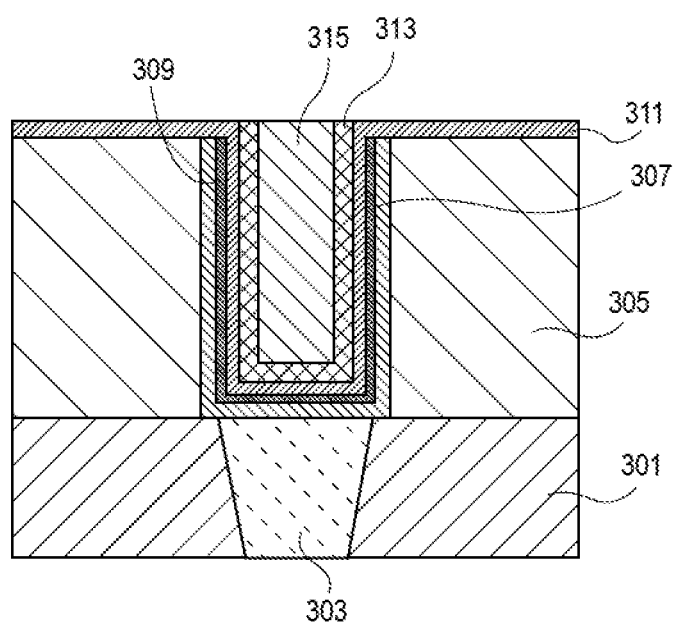

Referring to FIG. 3F, after one or more operations that result in the cross-section shown in FIG. 3E, a metal layer 313 is formed on the oxide layer 311 that is formed on the seed layer 309; and a metal fill 315 is formed in a space defined by the metal layer 313. In an embodiment, the metal layer 313 and the metal fill 315 can be formed by physical vapor deposition (PVD), chemical vapor deposition (CVD), electrochemical deposition (ECD), molecular beam epitaxy (MBE) or atomic layer deposition (ALD). In other embodiments, the metal layer 313 and the metal fill 315 can be formed in other manners.

Figure 3H:
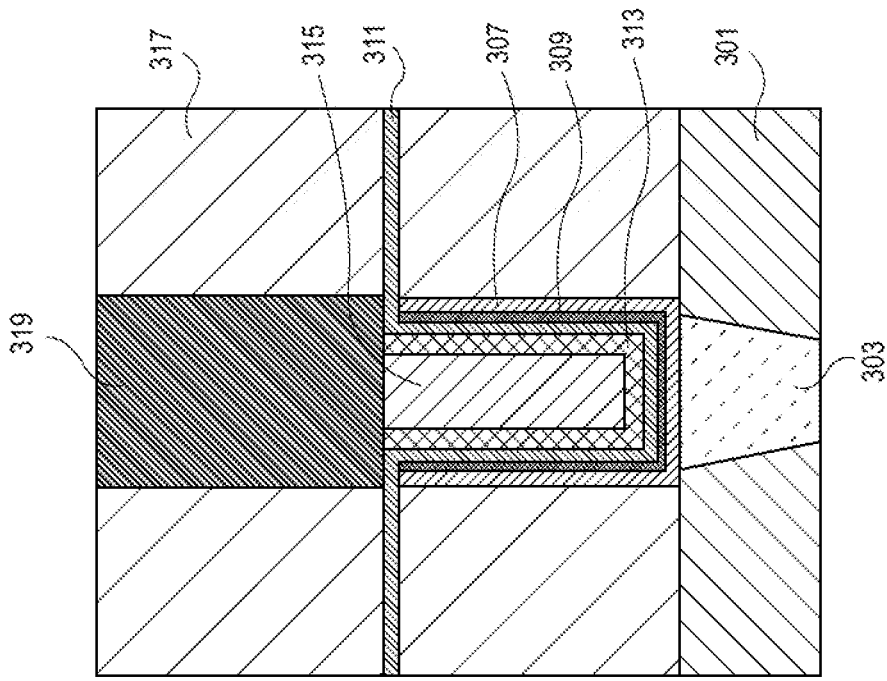
Figure 3G:
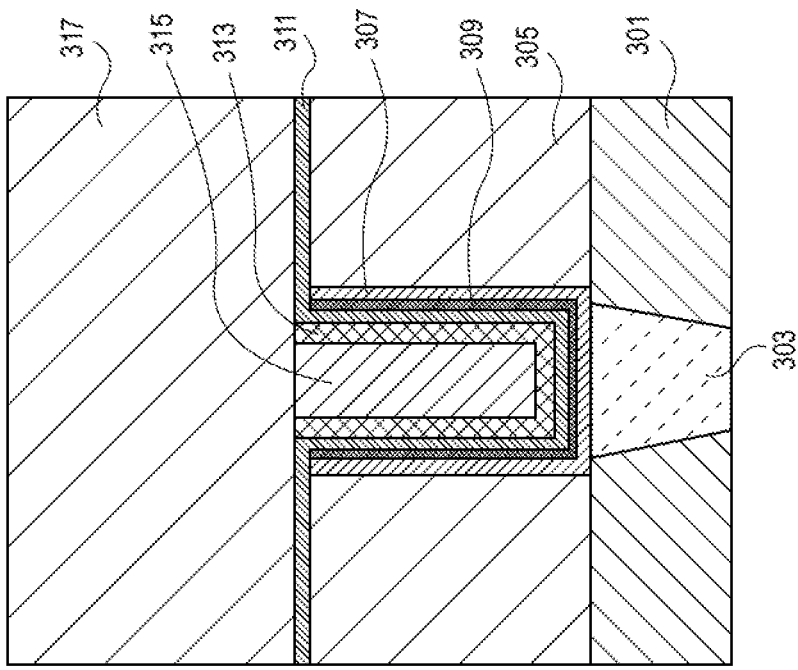

Referring to FIG. 3G, subsequent to one or more operations that result in the cross-section shown in FIG. 3F, dielectric 317 is formed above the top surface of the MFM capacitor structure. In an embodiment, the dielectric 317 can be formed by physical vapor deposition (PVD), chemical vapor deposition (CVD), electrochemical deposition (ECD), molecular beam epitaxy (MBE) or atomic layer deposition (ALD).

Referring to FIG. 3H, subsequent to one or more operations that result in the cross-section shown in FIG. 3G, an opening is formed in the dielectric 317 and a connector metal 319 is formed in the opening. In an embodiment, the connector metal 319 can be formed by physical vapor deposition (PVD), chemical vapor deposition (CVD), electrochemical deposition (ECD), molecular beam epitaxy (MBE) or atomic layer deposition (ALD). In other embodiments, the connector metal 319 can be formed in other manners.

FIGS. 4A-4D illustrate cross-sections of a MFM capacitor structure that includes multilayer oxides and metals during the fabrication of a MFM capacitor that includes multilayer oxides and metals according to an embodiment.

Figure 4A:
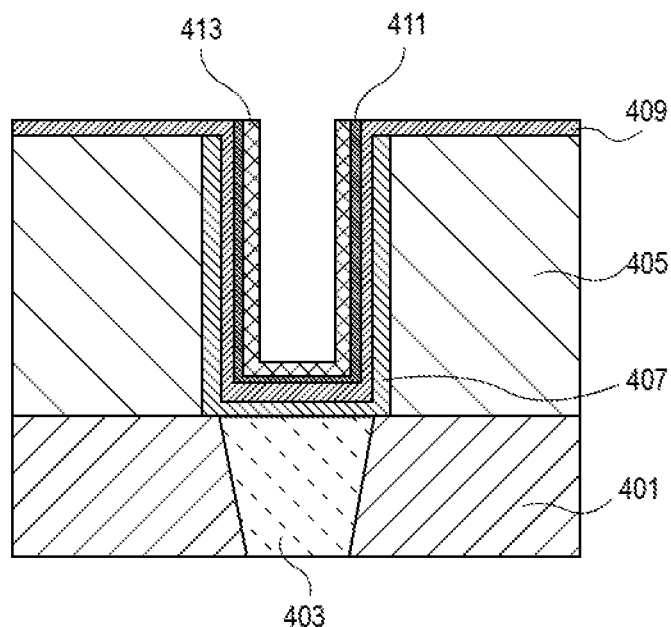

Referring to FIG. 4A, subsequent to one or more operations a structure is formed that includes dielectric layer 401, via 403, dielectric layer 405, a metal layer 407, an oxide layer 409, a low-T metal layer 411 and a top electrode metal layer 413. In an embodiment, the oxide layer 409 forms a ferroelectric layer on top of the metal layer 407. In an embodiment, forming the low-T metal layer 411 on the oxide layer 409 and performing a post-deposition anneal causes the oxide layer 409 to be stabilized in the polar orthorhombic phase. In an embodiment, causing the oxide layer 409 to assume a polar orthorhombic phase ensures the ferroelectric character of the oxide layer 409. In particular, the capping of the oxide layer 409 with a thin low temperature ALD metal (low-T metal layer 411) followed by the performance of the post-deposition anneal applies a mechanical constraint on the oxide layer 409 that prevents transition of the oxide layer 409 to a monoclinic phase and ensures its ferroelectric character. In an embodiment, the metal layer 407 can be formed by atomic layer deposition. In other embodiments, the metal layer 407 can be formed by physical vapor deposition (PVD), chemical vapor deposition (CVD), electrochemical deposition (ECD), or molecular beam epitaxy (MBE). In still other embodiments, the metal layer 407 can be formed in other manners. In an embodiment, the oxide layer 409 can be formed by atomic layer deposition. In other embodiments, the oxide layer 409 can be formed by physical vapor deposition (PVD), chemical vapor deposition (CVD), electrochemical deposition (ECD), or molecular beam epitaxy (MBE). In still other embodiments, the oxide layer 409 can be formed in other manners. In an embodiment, a low-T metal layer 411 can be formed by atomic layer deposition. In other embodiments, the low-T metal layer 411 can be formed by physical vapor deposition (PVD), chemical vapor deposition (CVD), electrochemical deposition (ECD), or molecular beam epitaxy (MBE). In still other embodiments, the low-T metal layer 411 can be formed in other manners. In an embodiment, a top electrode metal layer 413 can be formed by atomic layer deposition. In other embodiments, the top electrode metal layer 413 can be formed by physical vapor deposition (PVD), chemical vapor deposition (CVD), electrochemical deposition (ECD), or molecular beam epitaxy (MBE). In still other embodiments, the top electrode metal layer 413 can be formed in other manners.

Figure 4B:
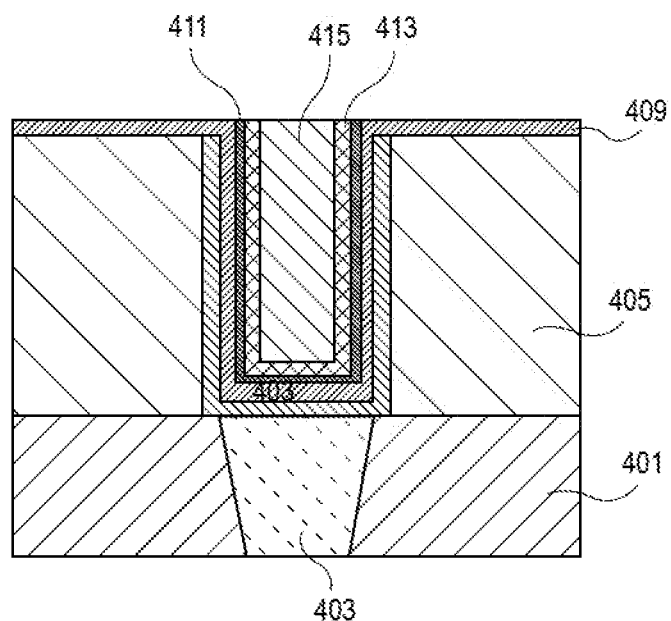

Referring to FIG. 4B, subsequent to one or more operations that result in a cross-section shown in FIG. 4A, a metal fill 415 is formed in a space defined by top electrode metal layer 413. In an embodiment, the metal fill 415 can be formed by physical vapor deposition (PVD), chemical vapor deposition (CVD), electrochemical deposition (ECD), molecular beam epitaxy (MBE) or atomic layer deposition (ALD). In other embodiments, the metal fill 415 can be formed in other manners.

Referring to FIG. 4C, subsequent to one or more operations that result in the cross-section shown in FIG. 4B, dielectric 417 is formed above the top surface of the MFM capacitor structure. In an embodiment, the dielectric 417 can be formed by physical vapor deposition (PVD), chemical vapor deposition (CVD), electrochemical deposition (ECD), molecular beam epitaxy (MBE) or atomic layer deposition (ALD). In other embodiments, the dielectric 417 can be formed in other manners.

Referring to FIG. 4D, subsequent to one or more operations that result in the cross-section shown in FIG. 4C, an opening is formed in the dielectric 417 and a connector metal 419 is formed in the opening. In an embodiment, the connector metal 419 can be formed by physical vapor deposition (PVD), chemical vapor deposition (CVD), electrochemical deposition (ECD), molecular beam epitaxy (MBE) or atomic layer deposition (ALD). In other embodiments, the connector metal 419 can be formed in other manners.

Figure 5:
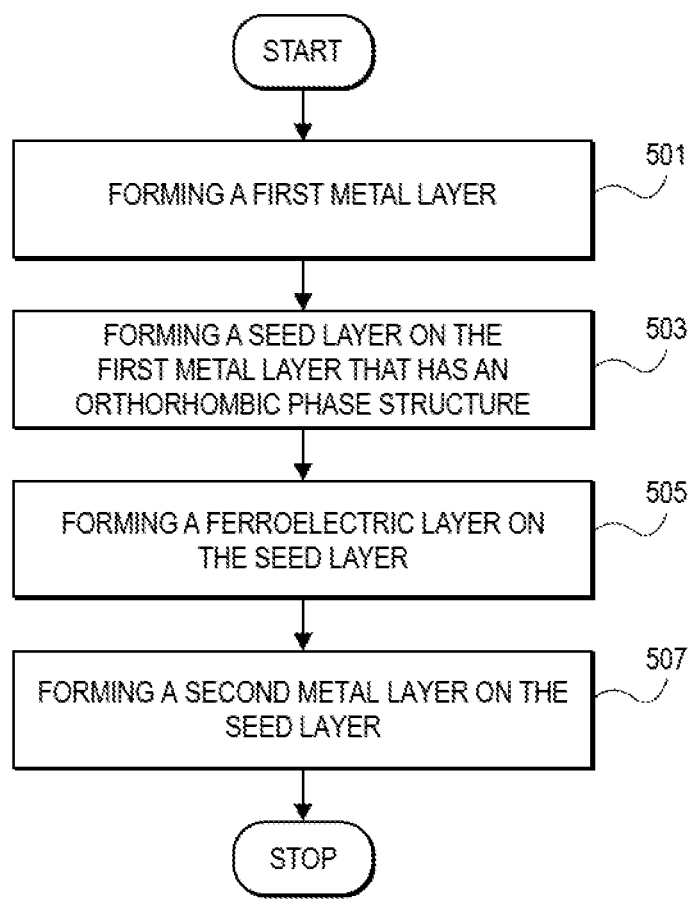
FIG. 5 illustrates a flowchart of a process of fabricating an MFM capacitor according to an embodiment.

FIG. 5 illustrates a flowchart of a method for forming an MFM capacitor with multilayer oxides and metals according to an embodiment. Referring to FIG. 5, the method for forming an MFM capacitor with multilayer oxides and metals includes, at 501, forming a first metal layer. At 503, forming a seed layer on the first metal layer that has a polar orthorhombic crystalline phase. At 505, forming a ferroelectric layer on the seed layer. At 507, forming a second metal layer on the ferroelectric layer. In an embodiment, the method further includes forming a metal via in a dielectric layer. In an embodiment, the seed layer is a templating layer. In an embodiment the seed layer has a predetermined lattice constant. In an embodiment, the ferroelectric layer includes a ferroelectric oxide.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide (SiO2) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, or zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, or conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, or aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, or silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And, in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 6:
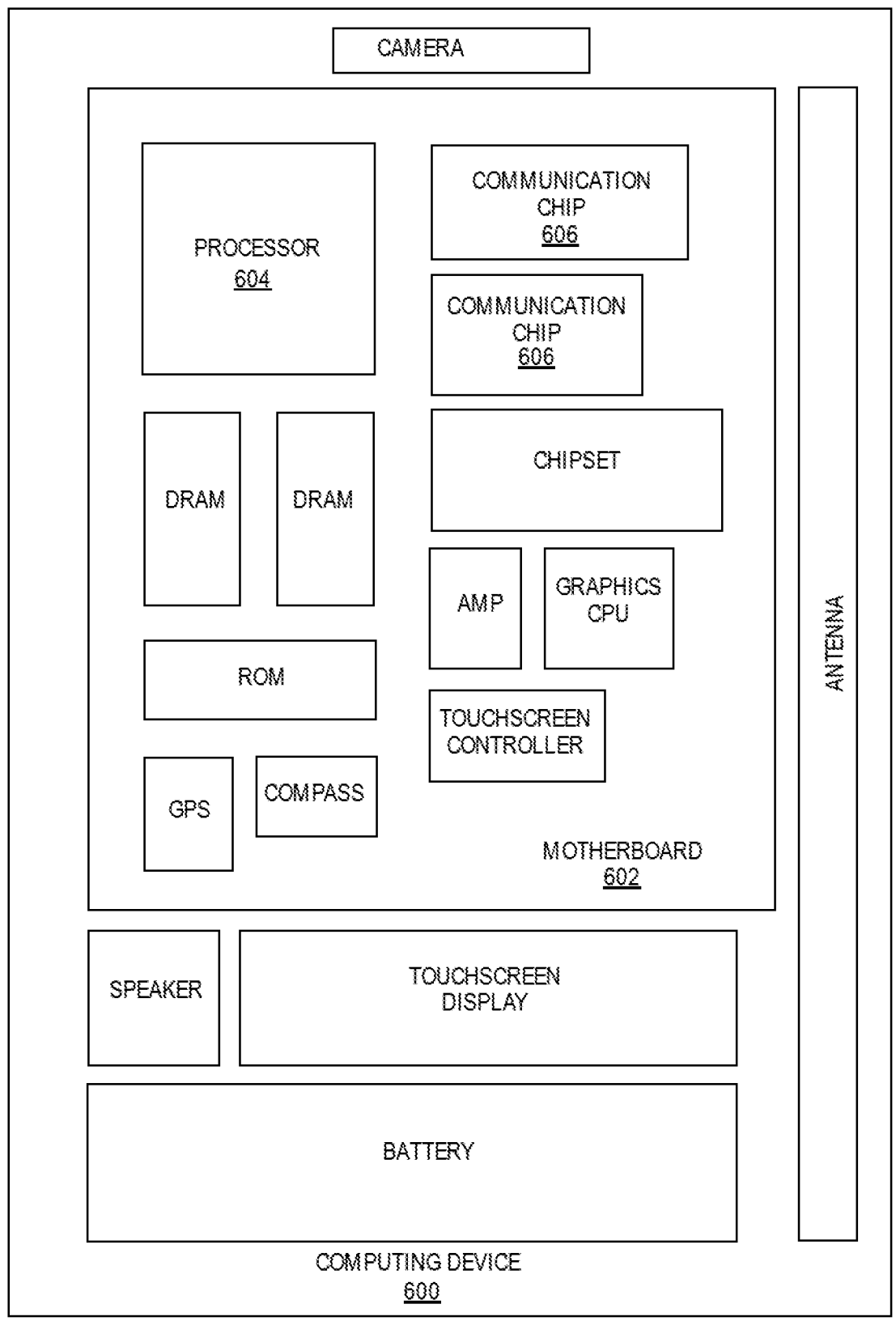
FIG. 6 illustrates a computing device in accordance with one implementation of an embodiment.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). In an embodiment, memory and/or logic systems of computing device 600 (such as but not limited to DRAM and/or DRAM that is embedded in logic) can include capacitors such as capacitor 200A described herein with reference to FIG. 2.

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip includes one or more devices, such as MOS-FET transistors built in accordance with implementations of the invention.

In further implementations, another component housed within the computing device 600 may contain an integrated circuit die that includes one or more devices, such as MOS-FET transistors built in accordance with implementations of the invention.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Figure 7:
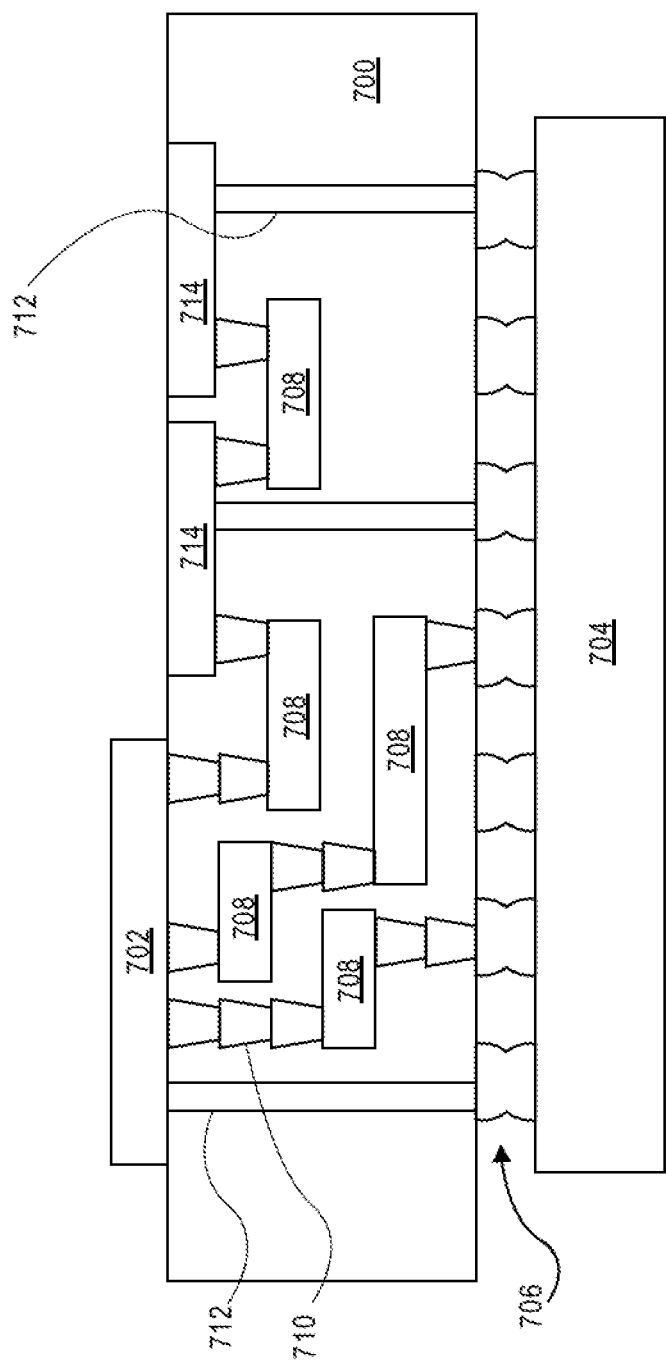
FIG. 7 illustrates an interposer that includes one or more embodiments.

FIG. 7 illustrates an interposer 700 that includes one or more embodiments of the invention. The interposer 700 is an intervening substrate used to bridge a first substrate 702 to a second substrate 704. The first substrate 702 may be, for instance, an integrated circuit die. The second substrate 704 may be, for instance, a memory module, a computer motherboard, or another integrated circuit die. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700. In accordance with embodiments of the invention, apparatuses or processes disclosed herein may be used in the fabrication of interposer 700.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example Embodiment 1

A capacitor, including a first metal layer, a seed layer on the first metal layer, a ferroelectric layer on the seed layer, the seed layer including a polar phase crystalline structure, and a second metal layer on the ferroelectric layer.

Example Embodiment 2

The capacitor of example embodiment 1, further comprising a metal via in a dielectric layer.

Example Embodiment 3

The capacitor of example embodiment 1, or 2, wherein the seed layer is a templating layer.

Example Embodiment 4

The capacitor of example embodiment 1, 2, or 3, wherein the seed layer has a predetermined lattice constant.

Example Embodiment 5

The capacitor of example embodiment 1, 2, 3, or 4, wherein the ferroelectric layer includes a ferroelectric oxide.

Example Embodiment 6

The capacitor of example embodiment 1, 2, 3, 4, or 5, wherein the capacitor is an MFM capacitor.

Example Embodiment 7

The capacitor of example embodiment 1, 2, 3, 4, 5, or 6, wherein the first metal layer is an atomic layer deposition (ALD) layer.

Example Embodiment 8

A capacitor including, a first metal layer in an opening in a first dielectric layer, a ferroelectric layer on the first metal layer; a second metal layer on the ferroelectric layer, and a third metal layer on the second metal layer, wherein the thickness of the third metal layer is greater than the thickness of the second metal layer.

Example Embodiment 9

The capacitor of example embodiment 8, wherein the second metal layer has a higher resistivity than the third metal layer.

Example Embodiment 10

The capacitor of example embodiment 8 or 9, wherein the second metal layer has a smaller grain size than the third metal layer.

Example Embodiment 11

The capacitor of example embodiment 8, 9, or 10, wherein the ferroelectric layer includes a ferroelectric oxide.

Example Embodiment 12

The capacitor of example embodiment 8, 9, 10, or 11, wherein the first metal layer is a conformal metal layer.

Example Embodiment 13

The capacitor of example embodiment 8, 9, 10, 11, or 12, wherein the capacitor is an MFM capacitor.

Example Embodiment 14

The capacitor of claim 8, 9, 10, 11, 12, or 13, further comprising a second dielectric layer under the first dielectric layer; and a metal via in the second dielectric layer.

Example Embodiment 15

A system including one or more processing components, and one or more data storage components, the data storage components including at least one capacitor, the at least one capacitor including, a first metal layer, a seed layer on the first metal layer, the seed layer including a polar phase crystalline structure, a ferroelectric layer on the seed layer, and a second metal layer on the ferroelectric layer.

Example Embodiment 16

The system of claim 15, further comprising a metal via in a dielectric layer.

Example Embodiment 17

The system of claim 15, or 16, wherein the seed layer is a templating layer.

Example Embodiment 18

The system of claim 15, 16 or 17, wherein the seed layer has a predetermined lattice constant.

Example Embodiment 19

The system of claim 15, 16, 17 or 18, wherein the ferroelectric layer includes a ferroelectric oxide.

Example Embodiment 20

A method including forming a space in a dielectric material, forming a first metal layer in the space in the dielectric material, forming a ferroelectric layer on the first metal layer, wherein the ferroelectric layer is amorphous, forming a low-T layer on the ferroelectric layer, wherein the ferroelectric layer remains amorphous after the low-T layer is formed, and forming a second metal layer on the low-T layer.

Example Embodiment 21

The method of example embodiment 20, wherein the low-T layer is formed at a temperature that is lower than the crystallization temperature of the ferroelectric layer.

Example Embodiment 22

The method of example embodiment 20, further comprising annealing the low-T layer to constrain the ferroelectric layer to a polar phase.

Example Embodiment 23

The method of example embodiment 20, wherein the forming the second metal layer includes forming the second metal layer at a temperature that is higher than the temperature at which the low-T layer is formed to constrain the ferroelectric layer to a polar phase.

Example Embodiment 24

The method of example embodiment 20, 21, 22, or 23 wherein the low-T layer is thinner than the second metal layer.

Example Embodiment 25

The method of claim 20, 21, 22, 23, or 24 wherein the low-T layer is formed at a temperature that is less than 500 degrees.

Example Embodiment 26

A method, including forming a first metal layer, forming a seed layer on the first metal layer, the seed layer including a polar phase crystalline structure, forming a ferroelectric layer on the seed layer, and forming a second metal layer on the seed layer.

Example Embodiment 27

The method of example embodiment 26, further comprising forming a metal via in a dielectric layer.

Example Embodiment 28

The method of example embodiment 26, or 27, wherein the seed layer is a templating layer.

Example Embodiment 29

The method of example embodiment 26, 27, or 28, wherein the seed layer has a predetermined lattice constant.

Example Embodiment 30

The method of example embodiment 26, 27, 28, or 29, wherein the ferroelectric layer includes an oxide.

Example Embodiment 31

The method of claim 26, 27, 28, 29, or 30, wherein the method comprises forming an MFM capacitor.

What is claimed is:

1. A capacitor, comprising:
    a first metal layer in a trench in a dielectric layer, the first metal layer having an uppermost surface at a same level as an uppermost surface of the dielectric layer;
    a seed layer on the first metal layer, the seed layer including a polar phase crystalline structure;
    a ferroelectric layer on the seed layer, the ferroelectric layer along and in contact with the uppermost surface of the dielectric layer; and
    a second metal layer on the ferroelectric layer, wherein the ferroelectric layer extends laterally beyond the second metal layer and laterally beyond the first metal layer, and wherein the ferroelectric layer has a bottommost surface below the uppermost surface of the first metal layer.

2. The capacitor of claim 1, further comprising a metal via in a second dielectric layer.

3. The capacitor of claim 1, wherein the seed layer is a templating layer.

4. The capacitor of claim 1, wherein the seed layer has a predetermined lattice constant.

5. The capacitor of claim 1, wherein the ferroelectric layer includes a ferroelectric oxide.

6. The capacitor of claim 1, wherein the capacitor is a metal-ferroelectric-metal (MFM) capacitor.

7. The capacitor of claim 1, wherein the first metal layer is a conformal metal layer.

8. A capacitor, comprising:
a first metal layer in an opening in a first dielectric layer, the first metal layer having an uppermost surface at a same level as an uppermost surface of the first dielectric layer;
a ferroelectric layer on the first metal layer, the ferroelectric layer along and in contact with the uppermost surface of the first dielectric layer;
a second metal layer on the ferroelectric layer; and
a third metal layer on the second metal layer, wherein the thickness of the third metal layer is greater than the thickness of the second metal layer, wherein the ferroelectric layer extends laterally beyond the second metal layer and the third metal layer and laterally beyond the first metal layer, and wherein the ferroelectric layer has a bottommost surface below the uppermost surface of the first metal layer.

9. The capacitor of claim 8, wherein the second metal layer has a higher resistivity than the third metal layer.

10. The capacitor of claim 8, wherein the second metal layer has a smaller grain size than the third metal layer.

11. The capacitor of claim 8, wherein the ferroelectric layer includes a ferroelectric oxide.

12. The capacitor of claim 8, wherein the first metal layer is a conformal metal layer.

13. The capacitor of claim 8, wherein the capacitor is an MFM capacitor.

14. The capacitor of claim 8, further comprising a second dielectric layer under the first dielectric layer; and a metal via in the second dielectric layer.

15. A system, comprising:
one or more processing components; and
one or more data storage components, the data storage components including at least one capacitor, the at least one capacitor including:
a first metal layerin a trench in a dielectric layer, the first metal layer having an uppermost surface at a same level as an uppermost surface of the dielectric layer;
a seed layer on the first metal layer, the seed layer including a polar phase crystalline structure;
a ferroelectric layer on the seed layer, the ferroelectric layer along and in contact with the uppermost surface of the dielectric layer; and
a second metal layer on the ferroelectric layer, wherein the ferroelectric layer extends laterally beyond the second metal layer and laterally beyond the first metal layer, and wherein the ferroelectric layer has a bottommost surface below the uppermost surface of the first metal layer.

16. The system of claim 15, further comprising a metal via in a second dielectric layer.

17. The system of claim 15, wherein the seed layer is a templating layer.

18. The system of claim 15, wherein the seed layer has a predetermined lattice constant.

19. The system of claim 15, wherein the ferroelectric layer includes a ferroelectric oxide.

\* \* \* \* \*